United States Patent
Hill et al.

(10) Patent No.: US 6,701,265 B2
(45) Date of Patent: Mar. 2, 2004

(54) CALIBRATION FOR VECTOR NETWORK ANALYZER

(75) Inventors: Thomas C. Hill, Beaverton, OR (US); Xiaofen Chen, West Linn, OR (US); Soraya J. Matos, Beaverton, OR (US); Leroy J. Willmann, Portland, OR (US); Kyle L. Bernard, Tigard, OR (US); Linley F. Gumm, Beaverton, OR (US)

(73) Assignee: Tektronix, Inc., Beaverton, OR (US)

( * ) Notice: Subject to any disclaimer, the term of this patent is extended or adjusted under 35 U.S.C. 154(b) by 0 days.

(21) Appl. No.: 10/093,171

(22) Filed: Mar. 5, 2002

(65) Prior Publication Data

US 2003/0171886 A1 Sep. 11, 2003

(51) Int. Cl.$^7$ ............................................... G01D 18/00
(52) U.S. Cl. .................................................... 702/91
(58) Field of Search ........................ 702/75, 76, 106, 702/186, 91, 85; 324/74, 76.19, 76.22, 601, 650

(56) References Cited

U.S. PATENT DOCUMENTS

| | | | | |
|---|---|---|---|---|
| 4,215,308 A | * | 7/1980 | Kusters | 324/76.61 |
| 4,746,879 A | * | 5/1988 | Ma et al. | 331/44 |
| 5,012,181 A | * | 4/1991 | Eccleston | 324/74 |
| 5,578,932 A | * | 11/1996 | Adamian | 324/601 |
| 5,587,934 A | * | 12/1996 | Oldfield et al. | 364/571.01 |

* cited by examiner

Primary Examiner—Michael Nghiem
(74) Attorney, Agent, or Firm—Francis I. Gray

(57) ABSTRACT

An improved calibration method for a vector network analyzer stores sparse calibration data, interpolates system error data from the sparse calibration data for each measurement by the vector network analyzer, and creates calibrated measurement data from the system error data and uncorrected measurement data at each measurement frequency. The sparse calibration data may be generated by measuring every Nth frequency step over a calibration frequency range greater than a specified measurement frequency range, or by measuring every frequency step over the calibration frequency range and compressing the resulting measurement data. The interpolation may be achieved by using a curve-fit algorithm, such as a parametric polynomial curve fitting algorithm.

13 Claims, 2 Drawing Sheets

CALIBRATION FOR VECTOR NETWORK ANALYZER

BACKGROUND OF THE INVENTION

The present invention relates to vector network analyzers, and more particularly to an improved calibration method for a vector network analyzer.

To obtain accurate results the users of vector network analyzers calibrate the instruments by measuring three known impedance standards, typically a short, an open and a characteristic impedance ($Z_0$) load for one-port measurements. For two-port measurements three additional measurements are performed using non-connection and through connections between the ports. Using the measured results of these measurements, the vector network analyzer's systematic errors are mathematically corrected, resulting in excellent measurement accuracy. Measurements consist of many stepped measurements at sequential frequencies that appear to be "swept" when a user is measuring a Device Under Test (DUT). Each measurement point has "calibration" data taken during the calibration routine that are stored and used for correcting that particular measurement point.

The problem is that, while the vector network analyzer gives excellent results, the calibration is done at each exact frequency step used in the measurement. For example if a vector network analyzer has a potential frequency measurement range of 25 MHz to 2500 MHz with 100 kHz frequency steps, then to gather calibration data for each frequency step requires 3×24,751=74,253 calibration measurements without taking multiple measurements for noise reduction. This large number of measurements requires an inordinate amount of time for calibration procedures. So instead the calibration is done over a specified measurement range, such as 500.5 MHz to 1011.5 MHz, which only requires 3×5,111=15,333 calibration measurements. However anytime that any frequency parameter, such as start frequency, stop frequency, number of frequency points, frequency resolution, etc., is changed by a user, the vector network analyzer must be re-calibrated. Many users do not need measurements of extreme accuracy, and they find re-calibrating the vector network analyzer each time a frequency variable is changed, even slightly, to be very cumbersome and time consuming. Therefore the user has the choice of either operating without calibration at all or of taking the time and effort of having excellent calibration.

Also prior vector network analyzers require low-phase-noise and low-amplitude-noise measurements, particularly for the calibration measurements. If there is any significant noise, as might be the case with low-cost hardware in the vector network analyzer, then many measurements are taken and a large amount of averaging is used to reduce the effect of the noise, adding another multiplier to the number of calibration measurements that need to be taken.

What is needed is a vector network analyzer that provides accuracy as well as ease of operation, even when low-cost hardware is used.

BRIEF SUMMARY OF THE INVENTION

Accordingly the present invention provides an improved calibration method for a vector network analyzer that acquires sparse calibration data across the frequency range of the vector network analyzer, or at least a larger range than a specified measurement frequency range. The sparse calibration data may be obtained by measuring every $N^{th}$ frequency step of the vector network analyzer, or by measuring each frequency step of the vector network analyzer and compressing the results. Then for each measurement frequency of the vector network analyzer a correction value is appropriately interpolated from the sparse calibration data to provide calibration error data. The calibration error data is then used to correct the measurement data to provide an accurate result.

The objects, advantages and other novel features of the present invention are apparent from the following detailed description when read in conjunction with the appended claims and attached drawing.

DETAILED DESCRIPTION OF THE INVENTION

Figure 1:
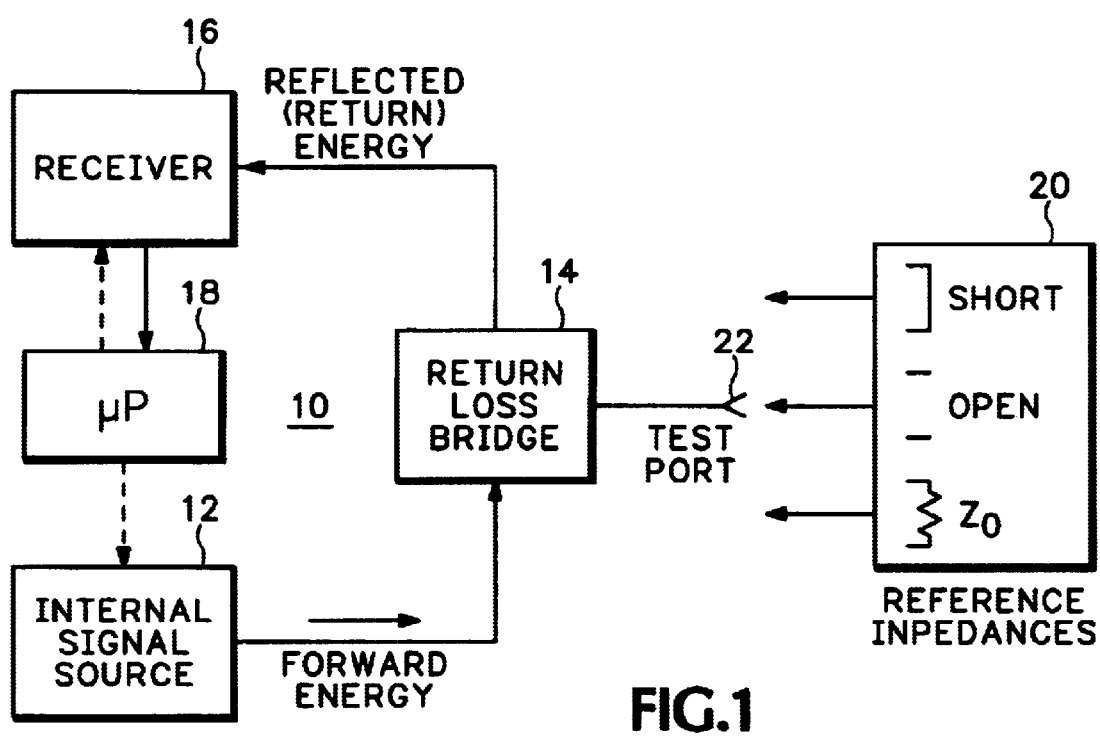
FIG. 1 is simple block diagram view of a vector network analyzer having improved calibration according to the present invention.

Referring now to FIG. 1 a vector network analyzer 10 in its simplest form is shown, having an internal signal source 12, a return loss bridge 14, a receiver 16 and a control processor 18. A calibration impedance 20 is selectively applied to a test port 22 of the return loss bridge 14 during calibration. The calibration impedance 20 generally includes an open, a short and a characteristic reference impedance. For each reference impedance a set of calibration measurements are stored in response to a forward path signal from the internal signal source 12, the reflection of which from the test port is processed by the receiver 16 as return data to generate the calibration measurement data in the form of complex (I, Q) reflection coefficients. Then the vector network analyzer 10 is coupled to a device or system under test for measurements to obtain reflection coefficients for such device or system. The measured reflection coefficients are corrected by the stored calibration reflection coefficients for the corresponding frequencies, as is well known in the art, to produce corrected measurement reflection coefficients for the device or system under test. (See "Principles of Microwave Measurements" by G. H. Bryant, Peter Peregrinons Ltd on behalf of the Institution of Electrical Engineers, Rev. Ed. 1993, pages 40–41)

It is possible during calibration to take and record return data—magnitude and phase—for each of several reference impedances, such as short, open and characteristic impedances, at every frequency point to which the vector network analyzer 10 may be tuned, such as 100 kHz steps over a 25 MHz to 2500 MHz range. This results in a massive amount of calibration data to store in the vector network analyzer 10, as indicated above, and requires large amounts of time to collect the data. The advantage of the improved calibration method disclosed below is the use of sparse calibration data over the entire tunable range or at least a larger range than desired for a particular set of measurements of the vector network analyzer 10, i.e., the amount of required stored data is reduced and the time required for calibration is significantly reduced, while still providing excellent measurement results. This may be accomplished by either simply measuring fewer frequency points during calibration, such as every $N^{th}$ frequency step (5 MHz steps for example for 3×496=1488 calibration data points), or by compressing the calibration data from measurements at each of the vector network analyzer frequency points using well-known techniques—especially effective for slowly changing data.

Interpolation methods then may be used to recreate from the sparse calibration data the detailed calibration data needed to correct the measurement results for any given measurement frequency step, the interpolation method used being consistent with the method of acquiring the sparse calibration data. This greatly reduces the amount of calibration data that needs to be saved, and hence time, when a "calibration" is performed. More importantly time is saved, not just because of the reduced data, but because of the greatly reduced tuning and settling times since many fewer frequency points are required. One of many such interpolation methods is a polynomial model based interpolation and least squares estimate for recreating more accurate calibration data, as described in greater detail below.

Different accuracy level calibrations also may be used: "Factory Calibration" which is a semi-permanently stored set of calibration data generated during manufacturing of the vector network analyzer; and "User Calibration" which is either performed for each use or saved from a recently performed calibration in the field. Each calibration of measurement results may use interpolated data generated from sparse calibration measurements. Factory Calibration provides reasonable accuracy, while User Calibration provides good to excellent accuracy.

Figure 2:
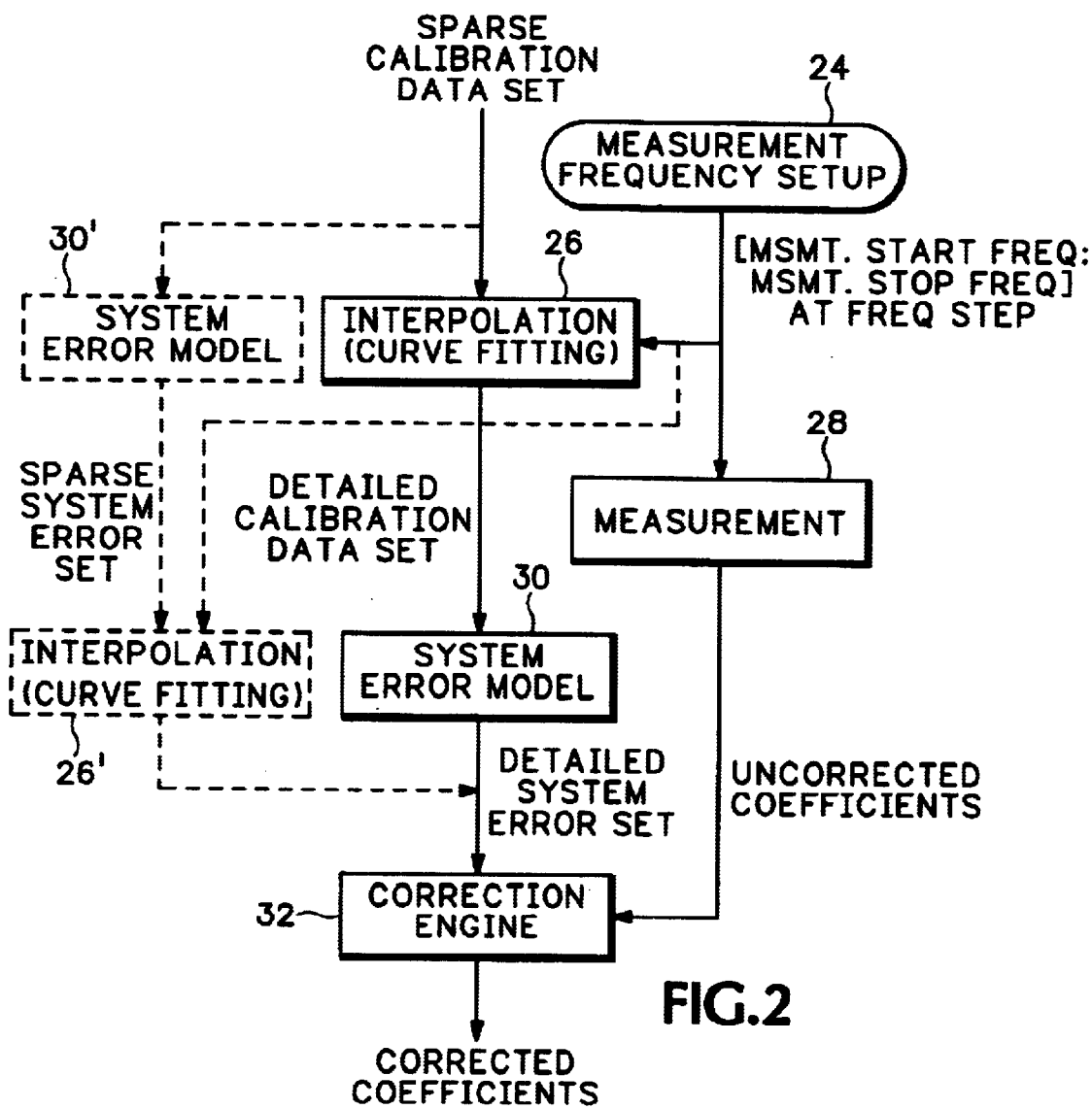
FIG. 2 is a flow diagram view of a measurement process using a sparse calibration data set according to the present invention.

As shown in FIG. 2 the measurement process includes a measurement frequency setup step 24 where the measurement parameters are established, such as Start Frequency, Stop Frequency and Frequency Step. These measurement parameters are input to an interpolation step 26, such as a curve-fit algorithm, together with the sparse calibration data which may cover the entire frequency span of the instrument and which at least includes the frequency range established by the measurement parameters to produce a detailed calibration data set for the measurement frequency range. The measurement parameters also are input to a measurement step 28 where measurements of a device or system under test are obtained to generate uncorrected measurement coefficients. The detailed calibration data set from the interpolation step 26 is input to a system error model step 30, as is well-known in the art, to generate a detailed system error set. The detailed system error set and the uncorrected measurement coefficients are input to a correction engine step 32, as is well-known in the art, to provide corrected measurement coefficients.

Alternatively the interpolation step 26' may be moved until after the system model error step 30', in which case the system model error step provides a sparse system error set to which the curve-fit algorithm is applied to obtain the detailed system error set for input to the correction engine step 32.

For two-port measurements, such as between the test port and the transmission port, the sparse calibration data set has six calibration measurement results as opposed to three calibration measurement results for the one-port measurement.

The use of interpolated detailed calibration data from sparse calibration data allows any calibration done by a user to automatically be extended to cover a larger frequency range than the immediately needed one, and may include the entire range of the vector network analyzer 10 as indicated above. If after this calibration the user changes any of the measurement parameters, the vector network analyzer 10 does not need re-calibration so it is kept in a calibrated state when frequency settings are changed. This provides the user with a vector network analyzer 10 that needs calibration far less often when it is used in the field.

When low-cost measurement hardware is used for the vector network analyzer 10, the curve-fit method described below for interpolation produces accurate results even when there are significant random errors due to noisy calibration measurements. It has been shown that the resulting calibration is as free of random errors as if many measurements had been taken at each frequency point and averaged. This improvement is still attained even if the "un-averaged noisy calibration" data being compared is taken at all possible frequency points, instead of just the sparse frequency points, and compressed to obtain the sparse calibration data. The resulting measurements made by a user still contain the noise present in the measurements, but the results are not impaired further by noisy calibration data.

A parametric polynomial curve fitting scheme may be used for the interpolation of sparse data points, as indicated above. Assuming the data follows the polynomial model $$P(x)=a_0+a_1x+a_2x^2+\ldots+a_kx^k$$

for N observation points $\{P(x_1)\ P(x_2)\ \ldots\ P(x_N)\}=P$ $$P=DA$$

where D is the set of data points $\{(1x_1\ \ldots\ x_1^k)\ (1x_2\ \ldots\ x_2^k)\ \ldots\ (1x_N\ \ldots\ x_N^k)\}$ and A is the set of coefficients $\{a_0 a_1 \ldots a_k\}$. Typically k=3 and N=(k+1)+2k. The least square solution of the polynomial model is $$A=(D'D)^{-1}D'P$$

For evenly spaced calculation data $\{x_1 x_2 \ldots x_N\}$ where $x_m=m$ $$D=\{(1\ 1\ \ldots\ 1^k)\ (1\ 2\ \ldots\ 2^k)\ \ldots\ (1\ N\ \ldots\ N^k)\}$$

Therefore $R=(D'D)^{-1}D'$ may be pre-calculated and the polynomial vector A is simply $$A=RP$$

The derived polynomial parameter vector A is best suited for calculating interpolated data in the range $[x_{1+k}, x_{1+2k}]$, where $x_{1+k}$ and $x_{1+2k}$ are frequency indexes of the sparse calibration data points. To follow data change closely vector A is updated every (k+1) interpolation units. Any data at frequency y, where $x_{1+k} \leq y \leq x_{1+2k}$ may be calculated as $$x=(y-x_1)/U+1 \text{ where } U=x_{i+1}-x_i$$

$$P(x)=[1\ x\ x^2\ \ldots\ x^k]A$$

Thus the present invention provides improved calibration for a vector network analyzer by acquiring sparse calibration data over a wide frequency range covered by the vector network analyzer, by doing measurements over a smaller specified measurement frequency range, by interpolating detailed system error data from the sparse calibration data for each measurement frequency, and by correcting the measurements with the corresponding detailed system error data.

What is claimed is:

1. An improved method of calibrating a vector network analyzer of the type that performs measurements over a user specified measurement frequency range less than a total frequency range for the vector network analyzer in discrete frequency steps and corrects the measurements using calibration data generated from reference impedances comprising the steps of:

storing sparse calibration data over a calibration frequency range of the vector network analyzer as the calibration data, the calibration frequency range being greater than the user specified measurement frequency range;

for each measurement by the vector network analyzer interpolating detailed system error data from the sparse calibration data; and using the detailed system error data to correct each measurement to provide calibrated measurements.

2. The improved method as recited in claim 1 wherein the storing step comprises the step of acquiring measurements generated from the reference impedances each $N^{th}$ discrete frequency step of the vector network analyzer over the calibration frequency range as the sparse calibration data.

3. The improved method as recited in claim 1 wherein the storing step comprises the steps of:

acquiring calibration data for each discrete frequency step of the vector network analyzer within the calibration frequency range; and compressing the calibration data to generate the sparse calibration data.

4. The improved method as recited in claims 1, 2 or 3 wherein the interpolating step comprises the steps of:

applying a curve-fit algorithm to the sparse calibration data to obtain detailed calibration data for each measurement frequency; and generating the detailed system error data from the detailed calibration data.

5. The improved method as recited in claim 4 wherein the calibration frequency range equals the total frequency range.

6. The improved method as recited in claim 4 wherein the curve-fit algorithm is a parametric polynomial curve fitting algorithm.

7. The improved method as recited in claims 1, 2 or 3 wherein the interpolating step comprises the steps of:

generating sparse system error data from the sparse calibration data; and applying a curve-fit algorithm to the sparse system error data to obtain the detailed system error data.

8. An improved method of calibrating a vector network analyzer of the type that performs measurements over a user specified measurement frequency range less than a total frequency range for the vector network analyzer in discrete frequency steps and corrects the measurements using calibration data generated from reference impedances comprising the steps of:

storing an initial set of sparse calibration data over the total frequency range as the calibration data;

storing a refined set of sparse calibration data over a calibration frequency range as the calibration data, the calibration frequency range being greater than the user specified measurement frequency range;

for each measurement by the vector analyzer interpolating detailed system error data from a selected one of the initial set of sparse calibration data and the refined set of sparse calibration data; and using the detailed system error data to correct each measurement to provide calibrated measurements.

9. The improved method as recited in claim 8 wherein the storing steps each comprise the step of acquiring measurements generated from the reference impedances each $N^{th}$ discrete frequency step of the vector network analyzer over the total frequency range for the initial set of sparse calibration data and over the calibration frequency range for the refined set of sparse calibration data.

10. The improved method as recited in claim 8 wherein the storing steps each comprise the steps of:

acquiring calibration data for each discrete frequency step of the vector network analyzer within the total frequency range for the initial set of sparse calibration data and within the calibration frequency range for the refined set of sparse calibration data; and compressing the calibration data to generate the sparse calibration data.

11. The improved method as recited in claims 8, 9 or 10 wherein the interpolating step comprises the steps of:

applying a curve-fit algorithm to the selected one of the sparse calibration data to obtain detailed calibration data for each measurement frequency; and generating the detailed system error data from the detailed calibration data.

12. The improved method as recited in claim 11 wherein the curve-fit algorithm is a parametric polynomial curve fitting algorithm.

13. The improved method as recited in claims 8, 9 or 10 wherein the interpolating step comprises the steps of:

generating sparse system error data from the selected one of the sparse calibration data; and applying a curve-fit algorithm to the sparse system error data to obtain the detailed system error data.

* * * * *